(12) United States Patent
Nam

(10) Patent No.: US 7,872,234 B2
(45) Date of Patent: Jan. 18, 2011

(54) COLOR IMAGE SENSING APPARATUS AND METHOD OF PROCESSING INFRARED-RAY SIGNAL

(75) Inventor: Jung Hyun Nam, Suwon-si (KR)

(73) Assignee: Maru LSI Co., Ltd., Suwon-si, Gyeonggi-do (KR)

( * ) Notice: Subject to any disclaimer, the term of this patent is extended or adjusted under 35 U.S.C. 154(b) by 89 days.

(21) Appl. No.: 11/907,128

(22) Filed: Oct. 9, 2007

(65) Prior Publication Data

US 2008/0315104 A1     Dec. 25, 2008

(30) Foreign Application Priority Data

Jun. 19, 2007     (KR) .................. 10-2007-0060036

(51) Int. Cl.
*G01J 5/20*     (2006.01)

(52) U.S. Cl. .................................. 250/338.4

(58) Field of Classification Search ... 250/338.1–338.5, 250/339.01–339.15, 226, 370.08
See application file for complete search history.

(56) References Cited

U.S. PATENT DOCUMENTS

| 6,292,212 | B1 * | 9/2001 | Zigadlo et al. ................. 348/33 |
| 6,459,450 | B2 * | 10/2002 | Bawolek et al. ............. 348/309 |
| 7,247,851 | B2 * | 7/2007 | Okada et al. ........... 250/339.02 |
| 2003/0169359 | A1 * | 9/2003 | Merrill et al. ................ 348/308 |
| 2004/0097021 | A1 * | 5/2004 | Augusto et al. ............. 438/149 |
| 2004/0174446 | A1 * | 9/2004 | Acharya ...................... 348/279 |
| 2006/0071156 | A1 * | 4/2006 | Masaki ........................ 250/226 |
| 2007/0145273 | A1 * | 6/2007 | Chang ..................... 250/338.1 |
| 2007/0201738 | A1 * | 8/2007 | Toda et al. ................... 382/144 |
| 2008/0135896 | A1 * | 6/2008 | Fan et al. ..................... 257/292 |

OTHER PUBLICATIONS

Gilblom et al., "Operation and performance of a color image sensor with layered photodiodes," 2003, SPIE Proceedings, vol. 5074, pp. 318-331.*
Adams et al., "Color processing in digital cameras," 1998, IEEE Micro, pp. 20-30.*
Shao et al., "Partition-based interpolation for color filter array demosaicking and super-resolution reconstruction," 2005, OPtical Engineering, vol. 44, No. 10, pp. 107003-1 to 107003-14.*

* cited by examiner

*Primary Examiner*—David P Porta
*Assistant Examiner*—Kiho Kim
(74) *Attorney, Agent, or Firm*—Sherr & Vaughn, PLLC

(57) ABSTRACT

A color image sensing apparatus and a method of processing an infrared-ray signal are provided. The image sensing apparatus includes: a color filter array including a plurality of color filter units, each color filter unit including a red-pass filter, a preen-pass filter, and a blue-pass filter, and at least one of the red-, green- and blue-pass filters passing infrared-rays; an image sensor for providing an image signal corresponding to light passing through the color filter array, the image signal including a red light signal, a green light signal, a blue light signal, and an infrared-ray signal; and an image signal processor for correcting and processing at least one of the red light signal, the green light signal and the blue light signal in response to the infrared-ray signal.

20 Claims, 8 Drawing Sheets

(a)

(b)

(c)

(d)

(a)

(b)

(a)

(b)

COLOR IMAGE SENSING APPARATUS AND METHOD OF PROCESSING INFRARED-RAY SIGNAL

CROSS-REFERENCE TO RELATED APPLICATION

This application claims priority to and the benefit of Korean Patent Application No. 2007-60036, filed Jun. 7, 2007, the disclosure of which is incorporated herein by reference in its entirety.

BACKGROUND

1. Field of the Invention

The present invention relates to a color image sensing apparatus, and a method of processing an infrared-ray signal.

2. Discussion of Related Art

A conventional color image sensing apparatus needs a color filter array, an image sensor, an image signal processor, and an infrared-ray (IR) blocking filter. This is because a red-pass filter, a green-pass filter and a blue-pass filter, which are included in the color filter array, pass red light, green light and blue light, respectively, and also pass infrared-rays having a wavelength of 700 nm. Spectral responses of the red-, green- and blue-pass filters are shown in FIG. 1. The IR blocking filter may be separately realized outside an image sensor chip, or realized by stacking a nitride layer and an oxide layer on a photodiode several times to prevent infiltration of the IR, as described in Korean Patent Publication No. 2002-17853 entitled "Image Sensor having Infrared-Ray Filter in Chip". However, the IR blocking filter has a disadvantage in that it greatly increases production costs for a color image sensing apparatus in any type of technology that it is used in.

SUMMARY OF THE INVENTION

The present invention is directed to a color image sensing apparatus which can remove an infrared-ray (IR) influence without a separate IR blocking filter and thus reduce production costs, and a method of processing an infrared-ray signal.

The present invention is also directed to a color image sensing apparatus which can increase precision of a measured color by compensating IR at a high illumination level, and can pick up an image in a dark environment by reinforcing a color using IR at a low illumination level, and a method of processing an infrared-ray signal.

The present research was performed as a part of the IT New Growth Engine Business Planning by the Ministry of Information and Communication (South Korea) and the Institute for Information Technology Advancement (South Korea) [2005-S111-02, Intelligent Robot Sensor].

One aspect of the present invention provides an imaging sensing apparatus including: a color filter array including a plurality of color filter units, each color filter unit including a red-pass filter passing red light, a green-pass filter passing green light, and a blue-pass filter passing blue light, and at least one of the red-, green- and blue-pass filters passing infrared-rays; an image sensor for providing an image signal corresponding to light passing through the color filter array, the image signal including a red light signal corresponding to the light passing through the red-pass filter, a green light signal corresponding to the light passing through the green-pass filter, a blue light signal corresponding to the light passing through the blue-pass filter, and an infrared-ray signal corresponding to the infrared-rays passing through the at least one filter; and an image signal processor for correcting and processing at least one of the red light signal, the green light signal and the blue light signal in response to the infrared-ray signal.

Another aspect of the present invention provides a method of processing an image signal, including the steps of: (a) receiving an image signal including a red light signal, a green light signal, a blue light signal, and an infrared-ray signal; and (b) correcting at least one of the red light signal, the green light signal, and the blue light signal in response to the infrared-ray signal. The red light signal may be provided from an image sensor and correspond to light passing through a red-pass filter, the green light signal may be provided from the image sensor and correspond to light passing through a green-pass filter, the blue light signal may be provided from the image sensor and correspond to light passing through a blue-pass filter, and the infrared-ray signal may be provided from the image sensor and correspond to infrared-rays passing through the at least one of filter.

Still another aspect of the present invention provides a light sensing device, including: a red-light photodiode formed in a semiconductor substrate and accumulating charges corresponding to light passing through a red-pass filter which passes infrared-rays as well as red light; a green-light photodiode formed in the semiconductor substrate and accumulating charges corresponding to light passing through a green-pass filter which passes infrared-rays as well as green light; a blue-light photodiode formed in the semiconductor substrate and accumulating charges corresponding to light passing through a blue-pass filter which passes infrared-rays as well as blue light; and an infrared-ray photodiode formed in the semiconductor substrate and accumulating charges corresponding to infrared-rays passing through the red, green and blue light photodiodes by disposing the infrared-ray photodiode below the red, green and blue light photodiodes.

Yet another aspect of the present invention provides a light sensing device, including: a semiconductor substrate of a first conductivity type; a first doping region formed in the semiconductor substrate, receiving light passing through a red-pass filter which passes infrared-rays as well as red light, and doped with an impurity of a second conductivity type opposite to the first conductivity type; a second doping region formed in the semiconductor substrate, receiving light passing through a green-pass filter which passes infrared-rays as well as green light, and doped with an impurity of the second conductivity type; a third doping region formed in the semiconductor substrate, receiving light passing through a blue-pass filter which passes infrared-rays as well as blue light, and doped with an impurity of the second conductivity type; and a fourth doping region formed in the semiconductor substrate, spaced apart from and below the first to third doping regions, receiving light passing through the first to third doping regions, and doped with an impurity of the second conductivity type.

Still yet another aspect of the present invention provides a method of controlling a pixel array comprising first to fourth pixels, each pixel including visible ray photodiodes and an infrared-ray photodiode, wherein each visible ray photodiode includes a red-light photodiode, two green light photodiodes and a blue-light photodiode, two of the visible ray photodiodes in the first pixel are disposed in a first row and the other photodiodes are disposed in a second row, two of the visible ray photodiodes in the second pixel are disposed in the first row and the other photodiodes are disposed in the second row, two of the visible ray photodiodes in the third pixel are disposed in a third row and the other photodiodes are disposed in a fourth row, and two of the visible ray photodiodes in the fourth pixel are disposed in the third row and the other photodiodes are disposed in the fourth row, the method comprising the steps of: (a) providing voltages corresponding to charges accumulated in the photodiodes disposed in the first row to first to fourth column lines; (b) providing voltages corresponding to charges accumulated in the photodiodes disposed in the second row to the first to fourth column lines; (c) providing voltages corresponding to charges accumulated in the photodiodes disposed in the third row to the first to fourth column lines; (d) providing voltages corresponding to charges accumulated in the photodiodes disposed in the fourth row to the first to fourth column lines; and (e) providing voltages corresponding to charges accumulated in the infrared-ray photodiodes in the first to fourth pixels to the first to fourth column lines.

Further another aspect of the present invention provides a pixel array including first to fourth pixels, wherein each of the first to fourth pixels includes visible ray photodiodes, an infrared-ray photodiode and an infrared-ray pixel circuit providing voltages corresponding to charges accumulated in the infrared-ray photodiode, each visible ray photodiode including a red-light photodiode, two green light photodiodes and a blue-light photodiode, and the infrared-ray pixel circuit including a plurality of transistors, wherein two visible ray photodiodes in the first pixel are disposed in a first row and two other photodiodes are disposed in a second row, two visible ray photodiodes in the second pixel are disposed in the first row and two other photodiodes are disposed in the second row, two visible ray photodiodes in the third pixel are disposed in a third row and two other photodiodes are disposed in a fourth row, two visible ray photodiodes in the fourth pixel are disposed in the third row and two other photodiodes are disposed in the fourth row, and wherein the plurality of transistors are disposed between at least two of spaces between rows disposed over or under the first to fourth rows.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Hereinafter, exemplary embodiments of the present invention will be described in detail. However, the present invention is not limited to the embodiments disclosed below, but can be implemented in various types. Therefore, the present exemplary embodiments are provided for complete disclosure of the present invention and to fully inform the scope of the present invention to those ordinarily skilled in the art.

Figure 2:
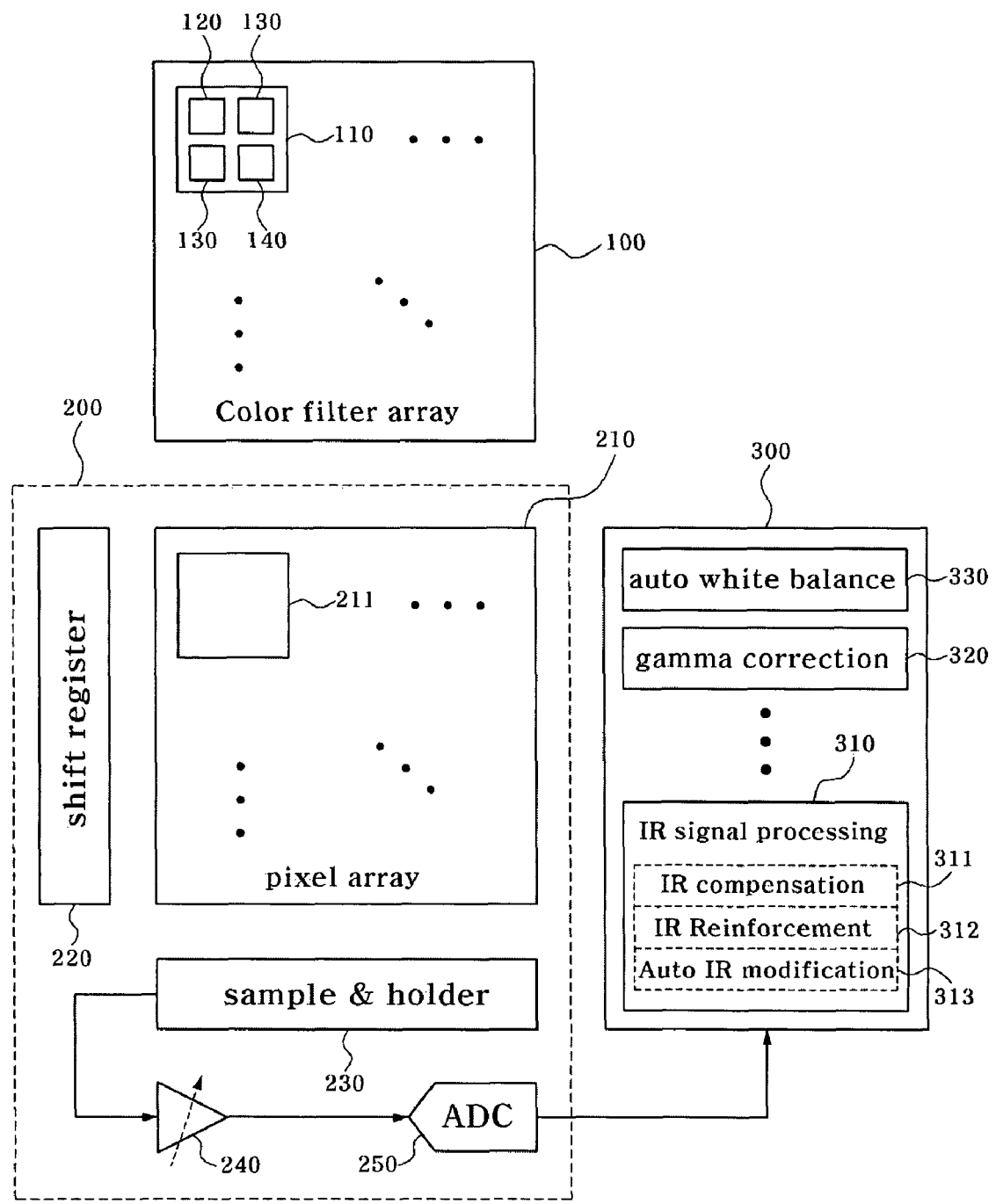
FIG. 2 schematically illustrates an image sensing apparatus according to an exemplary embodiment of the present invention.

FIG. 2 schematically illustrates an image sensing apparatus according to an exemplary embodiment of the present invention. Referring to FIG. 2, the image sensing apparatus includes a color filter array 100, an image sensor 200, and an image signal processor 300.

Figure 1:
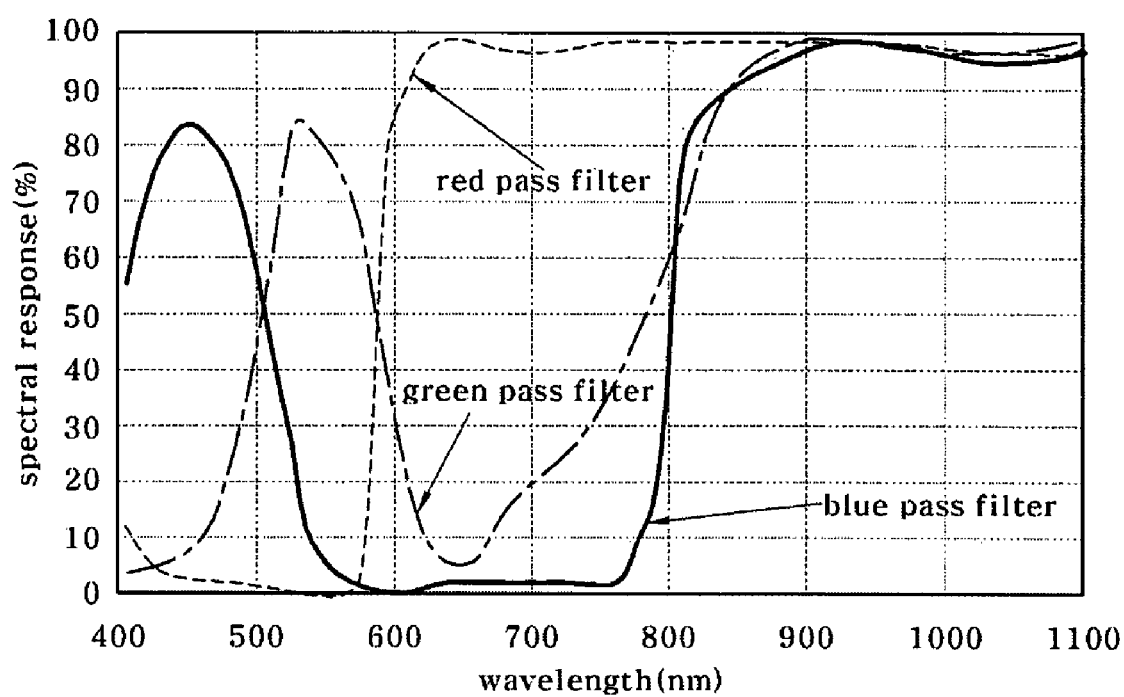
FIG. 1 shows spectral responses of a red-pass filter, a green-pass filter and a blue-pass filter.

The color filter array 100 is formed of an array of color filter units 110. Each color filter unit 110 includes a red-pass filter 120, a green-pass filter 130, and a blue-pass filter 140. At least one of the red-pass filter 120, the green-pass filter 130 and the blue-pass filter 140 passes infrared-rays (IR). For example, as shown in FIG. 1, the red-pass filter 120 passes the IR as well as red light, the green-pass filter 130 passes the IR as well as green light, and the blue-pass filter 140 passes the IR as well as blue light. In general, the color filter array 100 is manufactured in an on-chip color filter array type. That is, the color filter array 100 is implemented in a single chip together with the image sensor 200.

The image sensor 200 provides an image signal, corresponding to light incident through the color filter array 100, to the image signal processor 300. The image signals output from the image sensor 200 include a red light signal, a green light signal, a blue light signal, and an IR signal. The image sensor 200 includes a pixel array 210, a shift register 220, a sample and holder 230, a gain controller 240 and an analog-to-digital converter (ADC) 250. The pixel array 210 provides analog image signals of pixels 211 selected in response to a control signal output from the shift register 220 to the sample and holder 230. The analog image signals provided by the pixel array 210 include a red light signal, a blue light signal, a green light signal, and an IR signal. While the pixel array 210 is illustrated in the drawing as having the pixels 211 two-dimensionally arranged, a pixel array in which pixels 211 are one-dimensionally arranged (e.g., a pixel array for a line sensor) is included in the scope of the present invention. Each of the pixels 211 includes a red-light photodiode (not illustrated), a green-light photodiode (not illustrated), a blue-light photodiode (not illustrated), an IR photodiode (not illustrated), and a pixel circuit (not illustrated). The pixel circuit provides a red light signal corresponding to charges accumulated in the red-light photodiode, a green light signal corresponding to charges accumulated in the green-light photodiode, a blue light signal corresponding to charges accumulated in the blue-light photodiode, and an IR signal corresponding to charges accumulated in the IR photodiode, to the sample and holder 230 in response to a control signal output from the shift register 220. The shift register 220 provides the control signal necessary for an operation of the pixel array 210 to the pixel array 210. The sample and holder 230 receives the analog image signals in parallel from the pixel array 210, and transmits them to the gain controller 240 in series. The gain controller 240 controls the gain of the analog image signal transmitted from the sample and holder 230. The ADC 250 transmits a digital image signal obtained by digitally converting the analog image signal transmitted from the gain controller 240 to the image signal processor 300.

The image signal processor 300 may perform IR signal processing 310. The image signal processor 300 may also perform functions other than the IR signal processing 310, for example, gamma correction 320, auto white balance 330, and so forth. The image signal processor 300 receives digital image signals including the red light signal, the green light signal, the blue light signal and the IR signal to perform the IR signal processing 310.

The IR signal processing 310 modifies at least one of the red, green and blue light signals included in the digital image signals in response to the IR signal included in the digital image signals. The IR signal processing 310 may be expressed in a matrix form as shown in the following Formula 1.

$$\begin{pmatrix} R' \\ G' \\ B' \end{pmatrix} = \begin{pmatrix} a_{11} & a_{12} & a_{13} & a_{14} \\ a_{21} & a_{22} & a_{23} & a_{24} \\ a_{31} & a_{32} & a_{33} & a_{34} \end{pmatrix} \begin{pmatrix} R \\ G \\ B \\ IR \end{pmatrix} \quad \text{[Formula 1]}$$

In Formula 1, R, G, B and IR denote a red light signal, a green light signal, a blue light signal and an IR signal included in digital image signals, respectively, R', G' and B' denote a red light signal, a green light signal and a blue light signal, which are obtained by IR signal processing, respectively, and $a_{11}$ to $a_{34}$ are predetermined coefficients. Further, $a_{11}$, $a_{22}$ and $a_{33}$ of the predetermined coefficients must not be 0, at least one of $a_{14}$, $a_{24}$ and $a_{34}$ must not be 0, and the others may or may not be 0. Examples of the IR signal processing 310 include IR compensation 311, IR reinforcement 312, and auto IR modification 313.

The IR compensation 311 means a reduction in IR influence on at least one of the red light signal, the green light signal and the blue light signal, which are included in the digital image signal. To be more specific, the red light signal included in the digital image signal is affected by the IR as well as the red light passing through the red-pass filter. For this reason, a clearer red light signal may be obtained by reducing the IR influence on the red light signal. Also, when the IR influence on the green and blue light signals included in the digital image signal is reduced, clearer green and blue light signals may be obtained.

The IR compensation 311 may be expressed in a matrix form as shown in Formula 1. Here, $a_{11}$, $a_{22}$ and $a_{33}$ of the predetermined coefficients must not be 0, and at least one of $a_{14}$, $a_{24}$ and $a_{34}$ must not be 0. If $a_{14}$ is not 0, it has to have a different sign from $a_{11}$, if $a_{24}$ is not 0, it has to have a different sign from $a_{22}$, and if $a_{34}$ is not 0, it has to have a different sign from $a_{33}$. Preferably, none of $a_{14}$, $a_{24}$ and $a_{34}$ is 0. An example of the matrix corresponding to the IR compensation 311 is expressed in Formula 2.

$$\begin{pmatrix} R' \\ G' \\ B' \end{pmatrix} = \begin{pmatrix} 2.5 & -0.2 & -0.5 & -1.5 \\ 0 & 1.5 & -0.2 & -0.3 \\ 0 & -0.2 & 1 & -0.2 \end{pmatrix} \begin{pmatrix} R \\ G \\ B \\ IR \end{pmatrix} \quad \text{[Formula 2]}$$

The IR reinforcement 312 means that at least one of the red, green and blue light signals are reinforced using the IR signal included in the digital image signal. To be more specific, in a dark environment, a subject may not be recognized using only the red, green and blue light signals. In this case, when at least one (preferably all) of the red, green and blue light signals is reinforced using the IR signal, a recognizable image whose color is not even clear may be ensured. The IR reinforcement 312 may be expressed in a matrix form as shown in Formula 1. Here, $a_{11}$, $a_{22}$ and $a_{33}$ of the predetermined coefficients must not be 0, and at least one of $a_{14}$, $a_{24}$ and $a_{34}$ must not be 0. If $a_{14}$ is not 0, it has to have the same sign as $a_{11}$, if $a_{24}$ is not 0, it has to have the same sign as $a_{22}$, and if $a_{34}$ is not 0, it has to have the same sign as $a_{33}$. Preferably, none of $a_{14}$, $a_{24}$ and $a_{34}$ is 0.

An example of the matrix corresponding to the IR compensation is expressed in Formula 3.

$$\begin{pmatrix} R' \\ G' \\ B' \end{pmatrix} = \begin{pmatrix} 1 & 0 & 0 & 1 \\ 0 & 1 & 0 & 1 \\ 0 & 0 & 1 & 1 \end{pmatrix} \begin{pmatrix} R \\ G \\ B \\ IR \end{pmatrix} \quad \text{[Formula 3]}$$

The auto IR modification 313 means that IR signal processing is performed differently according to a brightness level (or illumination). The brightness level may be measured in various ways, for example, which may be an average of an average of the red light signal included in the digital image signal, an average of the green light signal included in the digital image signal, or an average of the blue light signal included in the digital image signal. The IR modification may be performed by a method of changing at least one of the coefficients $a_{11}$ to $a_{34}$ expressed in Formula 1 according to a brightness level. As an example of the auto IR modification 313, the IR compensation may be performed at a high brightness level, and the IR reinforcement may be performed at a low brightness level. That is, at a high brightness level, the operation such as shown in Formula 2 may be performed, and at a low brightness level, the operation such as shown in Formula 3 may be performed. The brightness level may be determined in comparison with a predetermined critical value. As another example of the auto IR modification 313, the degree of IR reinforcement may depend on a brightness level. The IR reinforcement depending on a brightness level may be expressed in a matrix form as shown in Formula 1. Here, $a_{11}$, $a_{22}$ and $a_{33}$ of the predetermined coefficients must not be 0, and at least one of $a_{14}$, $a_{24}$ and $a_{34}$ must not be 0. When $a_{14}$ is not 0, its sign should be the same as $a_{11}$ and its absolute value has to be increased as the brightness level becomes lower. When $a_{24}$ is not 0, its sign should be the same as $a_{22}$ and its absolute value has to be increased as the brightness level becomes lower. Also, when $a_{34}$ is not 0, its sign should be the same as $a_{33}$ and its absolute value has to be increased as the brightness level becomes lower. An example of the matrix corresponding to the IR reinforcement depending on the brightness level is expressed in Formula 4.

$$\begin{pmatrix} R' \\ G' \\ B' \end{pmatrix} = \begin{pmatrix} 1 & 0 & 0 & g \\ 0 & 1 & 0 & g \\ 0 & 0 & 1 & g \end{pmatrix} \begin{pmatrix} R \\ G \\ B \\ IR \end{pmatrix} \quad \text{[Formula 4]}$$

In Formula 4, coefficient g has the highest value (e.g., 1) at a brightness of a first level or less (very dark), and the lowest value (e.g., 0) at a brightness of a second level or more (very bright). Further, coefficient g may be inversely proportional to the brightness ranging from the first level to the second level.

Figure 3:
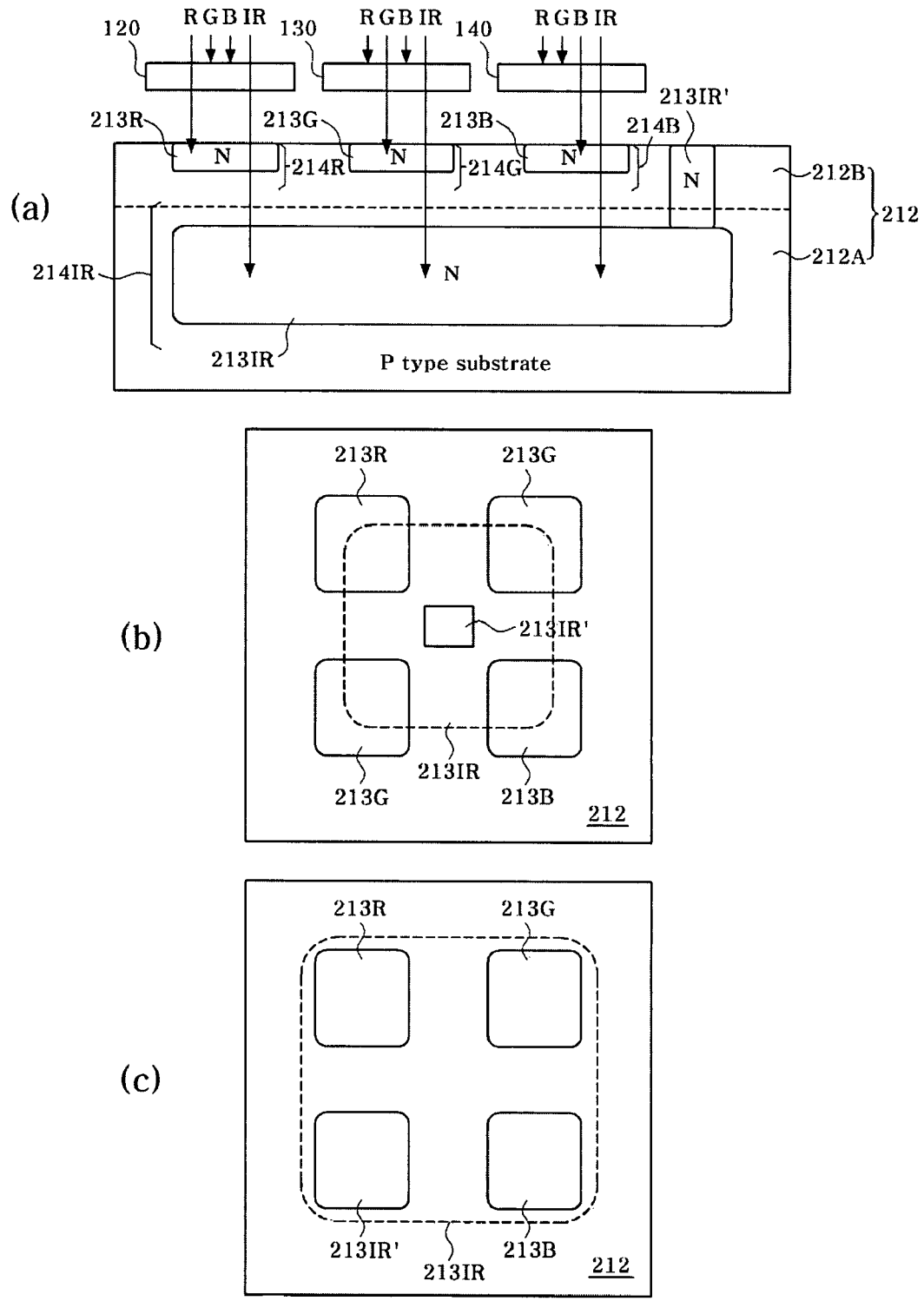
FIG. 3 illustrates red, green and blue photodiodes employed in the image sensing apparatus of FIG. 2, wherein (a) of FIG. 3 is a cross-sectional view of a light sensing device, and (b) and (c) of FIG. 3 are plan views of the light sensing device.

FIG. 3 illustrates red, green and blue light photodiodes and infrared-ray photodiodes (hereinafter, referred to as "light sensing devices"), which are employed in the image sensing apparatus of FIG. 2. In FIG. 3, (a) is a cross-sectional view of the light sensing device, and (b) and (c) are plan views of the light sensing device.

Referring to FIG. 3, the light sensing device includes a semiconductor substrate 212, and first to fifth doping regions 213R, 213G, 213B, 213IR and 213IR' formed in the semiconductor substrate 212.

The semiconductor substrate 212 may be doped with a P-type or N-type impurity, which has a first conductivity type. In FIG. 3, a P-type semiconductor substrate 212 is illustrated. The semiconductor substrate 212 may be a silicon substrate. The semiconductor substrate 212 may include an original semiconductor substrate 212A and an epitaxial layer 212B grown thereon as shown in FIG. 3. In this case, the epitaxial layer 212B has the same conductivity type as the original semiconductor substrate 212A. An interface between the original semiconductor substrate 212A and the epitaxial layer 212B may be interposed between the first to third doping regions 213R, 213G and 213B, and the fourth doping region 213IR. Alternatively, the semiconductor substrate 212 may not include the epitaxial layer 212B. When the semiconductor substrate 212 includes the epitaxial layer 212B, the fourth doping region 213IR may be formed deeper than when the semiconductor substrate 212 does not include the epitaxial layer 212B.

The first doping region 213R is formed in the semiconductor substrate 212, which is doped with an impurity of a second conductivity type opposite to a first conductivity type, and senses light incident through the red-pass filter 120. In FIG. 3, the first doping region 213R doped with an N-type impurity is illustrated. A red-light photodiode 214R is formed of the first doping region 213R and the semiconductor substrate 212, which are coupled to each other. A backward bias is applied to the red-light photodiode 214R. The red-pass filter 120 passes the IR as well as the red light, as illustrated in FIG. 3. Since light having a longer wavelength is less absorbed into a semiconductor material, the IR having a relatively longer wavelength may penetrate into a deeper region than the red light having a relatively shorter wavelength, and thus the IR passing through the red-pass filter 120 may be sensed in the fourth doping region 213IR.

The second doping region 213G is formed in the semiconductor substrate 212, which is doped with an impurity of a second conductivity type, and senses light incident through the green-pass filter 130. In FIG. 3, the second doping region 213G doped with an N-type impurity is illustrated. A green-light photodiode 214G is formed of the second doping region 213G and the semiconductor substrate 212, which are coupled to each other. A backward bias is applied to the green-light photodiode 214G. The green-pass filter 130, as illustrated in FIG. 3, passes the IR as well as the green light. Since light having a longer wavelength is less absorbed into a semiconductor material, the IR having a relatively longer wavelength may penetrate into a deeper region than the green light having a relatively shorter wavelength, and thus the IR passing through the green-pass filter 130 may be sensed in the fourth doping region 213IR.

The third doping region 213B is formed in the semiconductor substrate 212, which is doped with an impurity of a second conductivity type, and senses light incident through the blue-pass filter 140. In FIG. 3, the third doping region 213B doped with an N-type impurity is illustrated. A blue-light photodiode 214B is formed of the third doping region 213B and the semiconductor substrate 212, which are coupled to each other. A backward bias is applied to the blue-light photodiode 214B. The blue-pass filter 140, as illustrated in FIG. 3, passes the IR as well as the blue light. Since light having a longer wavelength is less absorbed into a semiconductor material, the IR having a relatively longer wavelength may penetrate into a deeper region than the blue light having a relatively shorter wavelength, and thus the IR passing through the blue-pass filter 140 may be sensed in the fourth doping region 213IR.

The fourth doping region 213IR is formed in the semiconductor substrate 212, which is doped with an impurity of a second conductivity type. The fourth doping region 213IR is spaced apart from and below at least one of the first to third doping regions 213R, 213G and 213B, and senses light incident through at least one of the red-, green- and blue-pass filters 120, 130 and 140. The fourth doping region 213IR may be disposed under the first to third doping regions 213R, 213G and 213B, as illustrated in FIG. 3. In this case, the fourth doping region 213IR may cover all of the first to third doping regions 213R, 213G and 213B as shown in (c) of FIG. 3, or partially cover the first to third regions 213R, 213G and 213B. A depth from the semiconductor substrate 212 to the fourth doping region 213IR has to be determined such that only a part of the red, green and blue light is transmitted, and the IR is sufficiently transmitted to be sensed, and thus the depth from the semiconductor substrate 212 to the fourth doping region 213IR is preferably 0.5 micrometers or more.

An IR photodiode 214IR is formed of the fourth doping region 213IR and the semiconductor substrate 212, which are coupled to each other. A backward bias is applied to the IR photodiode 214IR. PN junction of the IR photodiode 214IR may be located deeper than those of the red, green and blue light photodiodes 214R, 214G and 214B to allow IR more than visible rays to be transmitted.

The fifth doping region 213IR' is formed in the semiconductor substrate 212, which is doped with an impurity of a second conductivity type. The fifth doping region 213 IR' is electrically connected to the fourth doping region 213IR, and formed between the fourth doping region and the surface of the semiconductor substrate to transfer a hole or electron formed in the fourth doping region 213IR to the surface of the semiconductor substrate 212.

Figure 4:
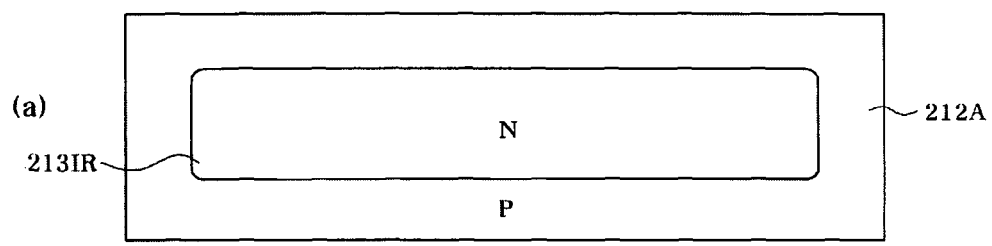
FIG. 4 illustrates a method of fabricating the light sensing device of FIG. 3.
Figure 4:
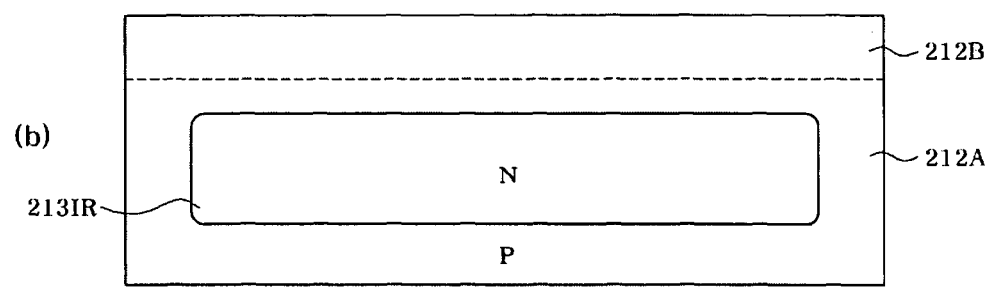
Figure 4:
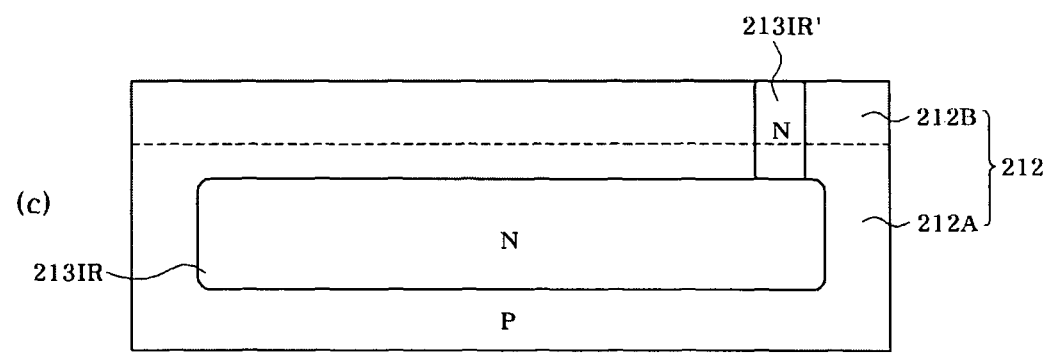
Figure 4:
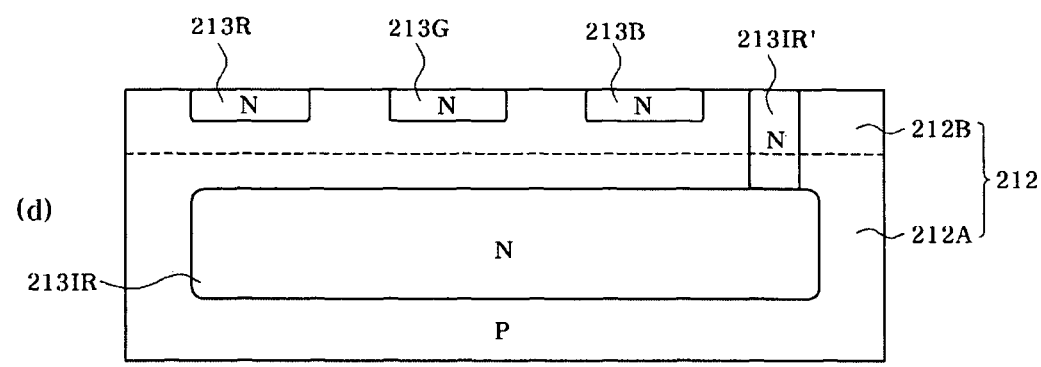

FIG. 4 illustrates a method of fabricating a light sensing device according to an exemplary embodiment of the present invention. In the fabrication method illustrated in FIG. 4, a semiconductor substrate 212 includes an original semiconductor substrate 212A, and an epitaxial layer 212B which is grown thereon.

Referring to FIG. 4, the method of fabricating the light sensing device includes the steps of forming a fourth doping region (a), growing an epitaxial layer (b), forming a fifth doping region (c), and forming first to third doping regions (d).

In step (a) of FIG. 4, the fourth doping region 213IR is formed by ion-implantation into the original semiconductor substrate 212A on which the epitaxial layer is not grown. The original semiconductor substrate 212A may be a silicon substrate, and doped with an impurity of a first conductivity type. The fourth doping region 213IR is doped with an impurity of a second conductivity type, which is opposite to the first conductivity type. In FIG. 4, the first conductivity type is P-type, and the second conductivity type is N-type. To form the fourth doping region, an ion-implantation mask (not illustrated) exposing a part in which the fourth region 213IR is to be formed is first formed on the semiconductor substrate 212A. Then, an N-type dopant is implanted into the substrate, thereby forming the fourth doping region. After that, the ion-implantation mask is removed, which may be formed of an oxide layer. The N-type dopant may be arsenic (As), and its dose may be $10^{11}$ to $10^{13}/cm^2$. Moreover, ion injection energy may be high in order to reduce the thickness of the epitaxial layer to be formed later, and is preferably 100 KeV or more. The fourth doping region may be referred to as a doping region for IR sensing.

In step (b) of FIG. 4, the epitaxial layer 212B may be grown to 0.2 to 0.4 micrometers. The epitaxial layer 212B may be doped with an impurity of a first conductivity type at a low temperature, and its doping concentration may be similar to that of the original semiconductor substrate 212A.

In step (c) of FIG. 4, the fifth doping region 213IR' is formed with an impurity of a second conductivity type by ion-implantation. To form the fifth doping region, an ion-implantation mask (not illustrated) is formed on the semiconductor substrate 212 to expose a part of the semiconductor substrate 212 to be the fifth doping region 213IR', and then an N-type dopant is implanted, thereby forming the fifth doping region 213IR'. After that, the ion-implantation mask is removed. The fifth doping region 213IR' is electrically connected with the doping region for IR sensing 213IR, and formed between the fourth doping region and the surface of the semiconductor substrate 212 to transfer a hole or electron formed in the doping region for IR sensing 213IR to the surface of the semiconductor substrate 212.

In step (d) of FIG. 4, the first to third doping regions 213R, 213G and 213B are formed with impurities of a second conductivity type by ion-implantation. To form these regions, an ion-implantation mask (not illustrated) exposing parts to be the first to third doping regions 213R, 213G and 213B is first formed on the semiconductor substrate 212, and then an N-type dopant is implanted, thereby forming the first to third doping regions 213R, 213G and 213B. After that, the ion-implantation mask is removed. Doping concentrations of the first to third doping regions may be $10^{12}$ ions/cm$^3$. At least one of the doping regions for sensing red, green and blue light 213R, 213G and 213B is formed over the doping region for IR sensing, and all of the doping regions for sensing red, green and blue light 213R, 213G and 213B may be formed over the doping region for IR sensing 213IR. The first to third doping regions 213R, 213G and 213B may be referred to as doping regions for sensing red, green and blue light, respectively.

The structure as shown in FIG. 3 is formed by the process performed in such a method. To sense IR, the doping region for IR sensing 213IR may be formed to a depth of 0.5 micrometers or more from the surface of the epitaxial layer 212B in the finally formed light sensing device. According to the fabrication method illustrated herein, the epitaxial layer 212B is formed after forming the doping region for IR sensing 213IR, and thus the doping region for IR sensing 213IR may be formed deep enough, for example, to a depth of 0.5 micrometers or more.

Figure 5:
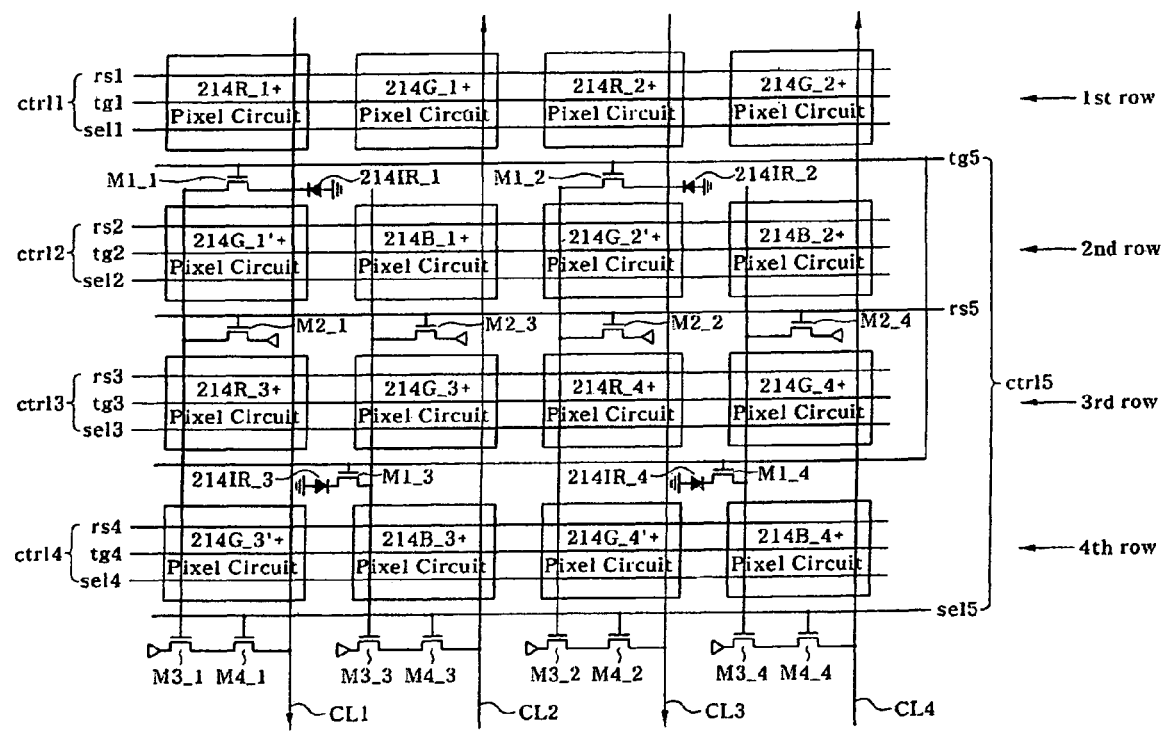
FIG. 5 illustrates interconnections of pixel circuits employed in the image sensing apparatus of FIG. 2.

FIG. 5 illustrates interconnections of pixel circuits employed in the image sensing apparatus of FIG. 2.

Referring to FIG. 5, a pixel array includes first to fourth pixels.

The first pixel includes visible ray photodiodes and an IR photodiode 214IR_1, each visible ray photodiode including a red-light photodiode 214R_1, two green light photodiodes 214G_1 and 214G_1' and a blue-light photodiode 214B_1. Both the photodiodes 214R_1 and 214G_1 of the visible ray photodiodes in the first pixel are located in a first row, and the other photodiodes 214G_1' and 214B_1 are located in a second row. A pixel circuit of the IR photodiode 214IR_1 includes a plurality of transistors M1_1 to M4_1 which are disposed between at least two of spaces between rows over or under the first to fourth rows.

The second pixel includes visible ray photodiodes and an IR photodiode 214IR_2, each visible ray photodiode including a red-light photodiode 214R_2, two green light photodiodes 214G_2 and 214G_2' and a blue-light photodiode 214B_2. Both the photodiodes 214R_2 and 214G_2 of the visible ray photodiodes in the second pixel are located in the first row, and the other photodiodes 214G_2' and 214B_2 are located in the second row. A pixel circuit of the IR photodiode 214IR_2 includes a plurality of transistors M1_2 to M4_2 which are disposed between at least two of spaces between rows over or under the first to fourth rows.

The third pixel includes visible ray photodiodes and an IR photodiode 214IR_3, each visible ray photodiode including a red-light photodiode 214R_3, two green-light photodiodes 214G_3 and 214G_3', and a blue-light photodiode 214B_3. Both the photodiodes 214R_3 and 214G_3 of the visible ray photodiodes in the second pixel are located in a third row, and the other photodiodes 214G_3' and 214B_3 are located in a fourth row. A pixel circuit of the IR photodiode 214IR_3 includes a plurality of transistors M1_3 to M4_3 which are disposed between at least two of spaces between rows over or under the first to fourth rows.

The fourth pixel includes visible ray photodiodes and an IR photodiode 214IR_4, each visible ray photodiode including a red-light photodiode 214R_4, two green-light photodiodes 214G_4 and 214G_4' and a blue-light photodiode 214B_4. Both the photodiodes 214R_4 and 214G_4 of the visible ray photodiodes in the second pixel are located in the third row, and the other photodiodes 214G_4' and 214B_4 are located in the fourth row. A pixel circuit of the IR photodiode 214IR_4 includes a plurality of transistors M1_4 to M4_4 which are disposed between at least two of spaces between rows over or under the first to fourth rows.

Voltages corresponding to charges accumulated in the photodiodes 214R_1, 214G_1, 214R_2 and 214G_2 disposed in the first row are applied to first to fourth columns CL1, CL2, CL3 and CL4 in response to a first control signal Ctrl1. Voltages corresponding to charges accumulated in the photodiodes 214G_1', 214B_1, 214G_2' and 214B_2 disposed in the second row are applied to the first to fourth column lines CL1, CL2, CL3 and CL4 in response to a second control signal Ctrl2. Voltages corresponding to charges accumulated in the photodiodes 214R_3, 214G_3, 214R_4 and 214G_4 disposed in the third row are applied to the first to fourth column lines CL1, CL2, CL3 and CL4 in response to a third control signal Ctrl3. Voltages corresponding to charges accumulated in the photodiodes 214G_3', 214B_3, 214G_4' and 214B_4 disposed in the fourth row are applied to the first to fourth column lines CL1, CL2, CL3 and CL4 in response to a fourth control signal Ctrl4. Voltages corresponding to charges accumulated in the photodiodes for an IR 214IR_1, 214IR_2, 214IR_3 and 214IR_4 are applied to the first to fourth column lines CL1, CL2, CL3 and CL4 in response to a fifth control signal Ctrl5. The fifth control signal Ctrl5 may be applied before or after applying one of the first to fourth control signals Ctrl1 to Ctrl4.

Figure 6:
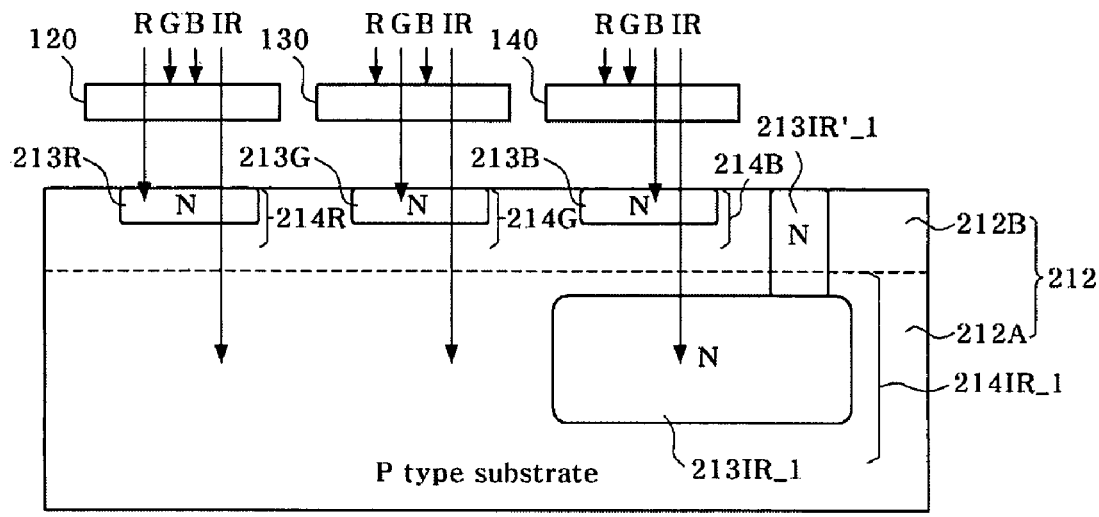
FIGS. 6 and 7 illustrate modified exemplary embodiments of the present invention.
Figure 6:
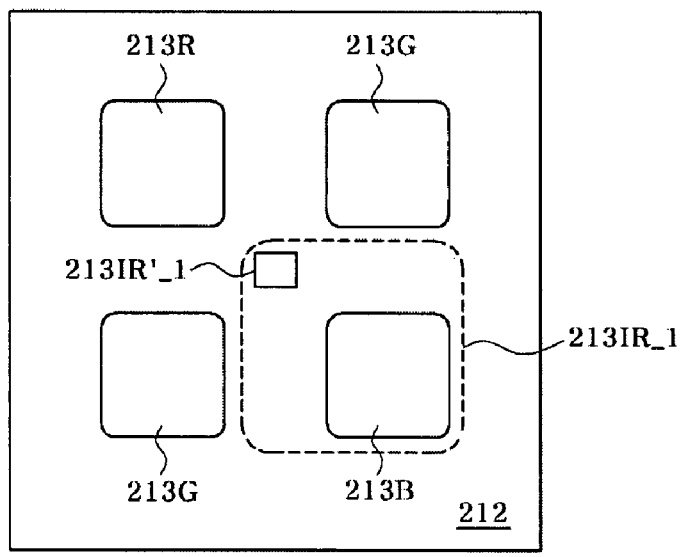

The present invention may be modified in a variety of ways. In an embodiment of the present invention, as illustrated in FIG. 6, an IR signal can include only a first IR signal corresponding to IR passing through a blue-pass filter 140, and an IR photodiode can include only a first IR photodiode 214IR_1 receiving IR passing through a blue-pass filter 140. In this case, the IR may be more precisely detected. To be more specific, when the IR photodiode is disposed under photodiodes for red light and green light, the red light and the green light as well as the IR reach the IR photodiode, which makes exact IR detection difficult. Alternatively, when the IR photodiode is disposed under a blue-light photodiode, the blue light having a relatively short wavelength rarely reaches the IR photodiode, which makes exact IR detection possible.

Figure 8:
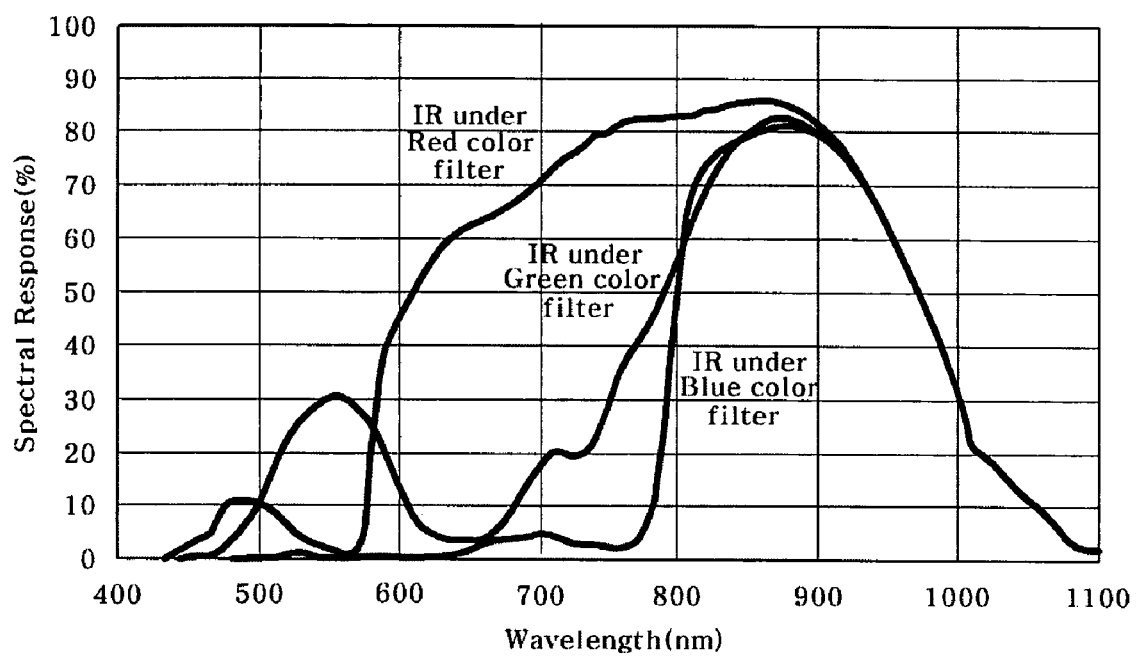
FIG. 8 shows the spectroscopic characteristics of an infrared-ray photodiode formed under a color filter.

Thus, a color may be more exactly compensated than when the color is compensated using the IR passing through the blue-pass filter. Also, the IR signal can include only a first IR signal corresponding to IR passing through the blue- and green-pass filters 140 and 130, and the IR photodiode can include only a first IR photodiode receiving the IR passing through the blue- and green-pass filters 140 and 130. When the photodiode receives the IR passing through the blue- and green-pass filters 140 and 130, a stronger signal may be obtained in a dark environment compared to when receiving the IR passing through only the blue-pass filter 140, and exact IR detection is possible compared to when receiving the IR passing through the red-, green- and blue-pass filters 120, 130 and 140. FIG. 8 shows the spectroscopic characteristics of the IR photodiode formed under a color-pass filter.

Figure 7:
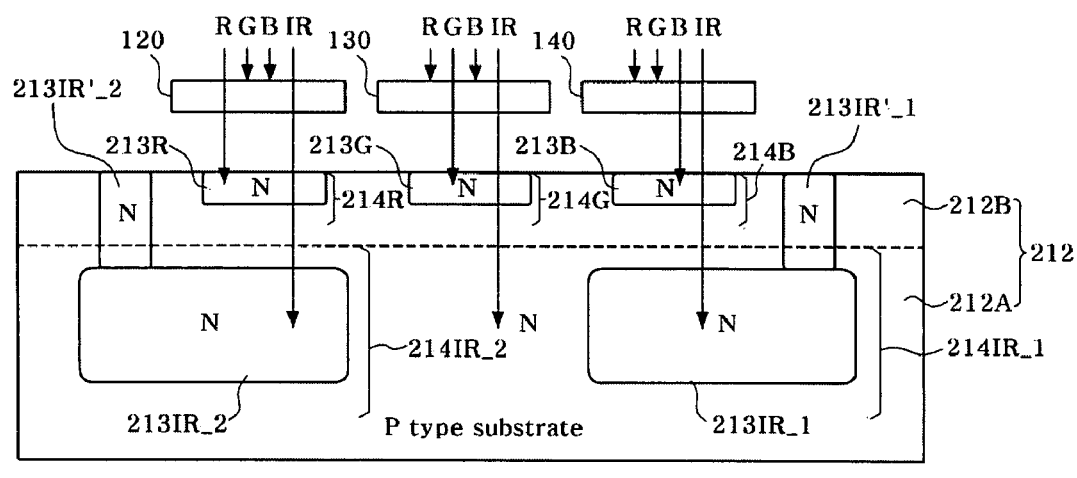
Figure 7:
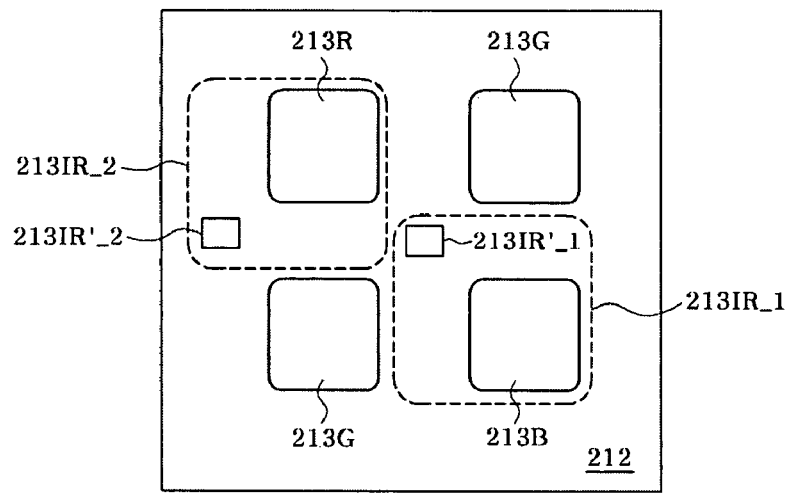

In another embodiment of the present invention, as illustrated in FIG. 7, an IR signal can include a first IR signal corresponding to IR passing through a blue-pass filter 140, and a second IR signal corresponding to IR passing through at least one of red- and green-pass filters 120 and 130, and an IR photodiode can include a first IR photodiode 214IR_1 receiving the IR passing through the blue-pass filter 140 and a second IR photodiode 214IR_2 receiving at least one of IRs passing through the red- and green-pass filters 120 and 130. In this case, similar to FIG. 6, a clearer color can be obtained by IR compensation using the first IR signal, and a stronger signal than in FIG. 6 can be obtained in a dark environment by IR reinforcement using the first and second IR signals. A circuit in FIG. 7 is somewhat more complex than that of FIG. 6.

A color image sensing apparatus and a method of processing an IR signal according to the present invention can remove or reduce the influence of the IR without a separate IR blocking filter.

According to the color image sensing apparatus and method of processing an IR signal, it is possible to reduce production costs.

According to the color image sensing apparatus and method of processing an IR signal, it is possible to form an image recognizable in a dark environment by compensating colors using IR at a low brightness level.

According to the color image sensing apparatus and method of processing an IR signal, it is possible to provide an image suitable for a given brightness level by differently processing an IR signal depending on a brightness level.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. An image sensing apparatus, comprising:
    a color filter array including a plurality of color filter units, wherein each color filter unit includes a red-pass filter for passing red light and infrared-rays, a green-pass filter for passing green light and infrared-rays, and a blue-pass filter for passing blue light and infrared-rays;
    an image sensor for generating a red light signal corresponding to the red light passing through the red-pass filter, a green light signal corresponding to the green light passing through the green-pass filter, a blue light signal corresponding to the blue light passing through the blue-pass filter, and an infrared-rays signal corresponding to the infrared-rays passing through at least one of the red-pass filter, the green-pass filter, and the blue-pass filter; and
    an image signal processor for correcting and processing at least one of the red light signal, the green light signal and the blue light signal in response to the infrared-ray signal,
    wherein the image signal processor reinforces at least one of the red, green, and blue signals in response to the infrared-ray signal.

2. The apparatus according to claim 1, wherein the image signal processor compensates at least one of the red, green, and blue signals in response to the infrared-ray signal to reduce an infrared-ray influence on at least one of the red, green, and blue signals.

3. The apparatus according to claim 1, wherein a degree of reinforcement of at least one of the red, green, and blue signals depends on a brightness or illumination level.

4. The apparatus according to claim 1, wherein the image signal processor corrects at least one of the red, green, and blue signals in a different way according to a brightness or illumination level.

5. The apparatus according to claim 1, wherein the image signal processor compensates at least one of the red, green, and blue signals in response to the infrared-ray signal at a high brightness or illumination level, and reinforces at least one of the red, green, and blue signals in response to the infrared-ray signal at a low brightness or illumination level.

6. The apparatus according to claim 5, wherein the image signal processor determines the brightness or illumination level according to a result obtained in comparison with a predetermined critical value.

7. The apparatus according to claim 1, wherein the image sensor comprises a pixel array including a plurality of pixels, each of which includes:
    a red-light photodiode formed in a semiconductor substrate and accumulating charges corresponding to the red light signal, wherein the red light signal is generated according to the red light passing through the red-pass filter;
    a green-light photodiode formed in the semiconductor substrate and accumulating charges corresponding to the green light signal, wherein the green light signal is generated according to the green light passing through the green-pass filter;
    a blue-light photodiode formed in the semiconductor substrate and accumulating charges corresponding to the blue light signal, wherein the blue light signal is generated according to the blue light passing through the blue-pass filter; and
    an infrared-ray photodiode formed in the semiconductor substrate and accumulating charges corresponding to the infrared-ray signal, wherein the infrared-ray signal is generated according to the infrared-rays passing through at least one of the red-pass filter, the green-pass filter, and the blue-pass filter.

8. The apparatus according to claim 7, wherein a PN junction of the infrared-ray photodiode is formed deeper than those of the red-light photodiode, the green-light photodiode, and the blue-light photodiode.

9. A method of processing an image signal, comprising the steps of:
    (a) receiving an image signal including a red light signal, a green light signal, a blue light signal, and an infrared-ray signal; and
    (b) correcting at least one of the red light signal, the green light signal, and the blue light signal in response to the infrared-ray signal,
    wherein the red light signal is provided from an image sensor and corresponds to red light passing through a red-pass filter, the green light signal is provided from the image sensor and corresponds to green light passing through a green-pass filter, the blue light signal is provided from the image sensor and corresponds to blue light passing through a blue-pass filter, and the infrared-ray signal is provided from the image sensor and corresponds to infrared rays passing through at least one of the red-pass filter, the green-pass filter, and the blue-pass filter, wherein the signal processing is performed by reinforcing at least one of the red, green, and blue signals in response to the infrared-ray signal.

10. The method according to claim 9, wherein the signal processing is expressed by the following formula, $$\begin{pmatrix} R' \\ G' \\ B' \end{pmatrix} = \begin{pmatrix} a_{11} & a_{12} & a_{13} & a_{14} \\ a_{21} & a_{22} & a_{23} & a_{24} \\ a_{31} & a_{32} & a_{33} & a_{34} \end{pmatrix} \begin{pmatrix} R \\ G \\ B \\ IR \end{pmatrix}$$

wherein R, G, B and IR denote the red light signal, the green light signal, the blue light signal, and the infrared-ray signal, respectively, R', G' and B' denote a red light signal, a green light signal, and a blue light signal obtained by the signal processing, respectively, and $a_{11}$ to $a_{34}$ are coefficients, wherein $a_{11}$, $a_{22}$ and $a_{33}$ are not 0 and at least one of $a_{14}$, $a_{24}$ and $a_{34}$ is not 0.

11. The method according to claim 9, wherein the signal processing is performed by compensating at least one of the red, green, and blue signals in response to the infrared-ray signal, so as to reduce an infrared-ray influence on at least one of the red, green, and blue signals.

12. The method according to claim 9, wherein a degree of reinforcement of at least one of the red, green, and blue signals depends on a brightness or illumination level.

13. The method according to claim 9, wherein the signal processing is performed by correcting at least one of the red, green, and blue signals depending on a brightness or illumination level.

14. The method according to claim 9, wherein the signal processing is performed by compensating at least one of the red, green, and blue signals in response to the infrared-ray signal at a high brightness or illumination level, and reinforcing at least one of the red, green, and blue signals in response to the infrared-ray signal at a low brightness or illumination level.

15. The method according to claim 14, wherein the brightness or illumination level is determined by a result obtained in comparison with a predetermined critical value.

16. A light sensing device, comprising:
a semiconductor substrate of a first conductivity type;
a first doping region formed in the semiconductor substrate, receiving red light passing through a red-pass filter which passes infrared-rays as well as the red light, and doped with an impurity of a second conductivity type opposite to the first conductivity type;
a second doping region formed in the semiconductor substrate, receiving green light passing through a green-pass filter which passes infrared-rays as well as the green light, and doped with an impurity of the second conductivity type;
a third doping region formed in the semiconductor substrate, receiving blue light passing through a blue-pass filter which passes infrared-rays as well as the blue light, and doped with an impurity of the second conductivity type; and
a fourth doping region formed in the semiconductor substrate, receiving light passing through the first to third doping regions, and doped with an impurity of the second conductivity type,
wherein the first, second, and third doping regions are coplanar and spaced apart from each other,
wherein the fourth doping region is spaced apart from and directly below the first, second, and third doping regions, and
wherein the fourth doping region receives the light directly from each one of the first, second, and third doping regions.

17. The light sensing device of claim 16, further comprising a fifth doing region formed between the fourth doping region and a surface of the semiconductor substrate,
wherein the fifth doing region is doped with an impurity of the second conductivity type and electrically connected to the fourth doping region.

18. A method of controlling a pixel array comprising first to fourth pixels, each pixel including visible ray photodiodes and an infrared-ray photodiode, wherein each visible ray photodiode includes a red-light photodiode, two green light photodiodes and a blue-light photodiode, two of the visible ray photodiodes in the first pixel are disposed in a first row and the other photodiodes are disposed in a second row, two of the visible ray photodiodes in the second pixel are disposed in the first row and the other photodiodes are disposed in the second row, two of the visible ray photodiodes in the third pixel are disposed in a third row and the other photodiodes are disposed in a fourth row, and two of the visible ray photodiodes in the fourth pixel are disposed in the third row and the other photodiodes are disposed in the fourth row, the method comprising the steps of:

(a) providing voltages corresponding to charges accumulated in the photodiodes disposed in the first row to first to fourth column lines;

(b) providing voltages corresponding to charges accumulated in the photodiodes disposed in the second row to the first to fourth column lines;

(c) providing voltages corresponding to charges accumulated in the photodiodes disposed in the third row to the first to fourth column lines;

(d) providing voltages corresponding to charges accumulated in the photodiodes disposed in the fourth row to the first to fourth column lines; and (e) providing voltages corresponding to charges accumulated in the infrared ray photodiodes in the first to fourth pixels to the first to fourth column lines, wherein the visible ray photodiodes are spaced apart from the infrared ray photodiode and the infrared ray photodiode is disposed below the visible ray photodiodes, and wherein the red-light photodiode accumulates charges corresponding to light passing through a red-pass filter, the green-light photodiode accumulates charges corresponding to light passing through a green-pass filter, the blue-light photodiode accumulates charges corresponding to light passing through a blue-pass filter, at least one of the red-pass filter, the green-pass filter, and the blue-pass filter passes the infrared-rays, and the infrared-ray photodiode accumulates charges corresponding to the infrared-rays directly from each one of the red-light photodiode, the green-light photodiode, and the blue-light photodiode.

19. The method according to claim 18, wherein step (e) is performed before or after anyone of steps (a) to (d) is performed.

20. A pixel array comprising first to fourth pixels,
- wherein each of the first to fourth pixels includes visible ray photodiodes, an infrared-ray photodiode and an infrared-ray pixel circuit providing voltages corresponding to charges accumulated in the infrared-ray photodiode, each visible ray photodiode including a red-light photodiode, two green light photodiodes and a blue-light photodiode, and the infrared-ray pixel circuit including a plurality of transistors,
- wherein two visible ray photodiodes in the first pixel are disposed in a first row and two other photodiodes are disposed in a second row, two visible ray photodiodes in the second pixel are disposed in the first row and two other photodiodes are disposed in the second row, two visible ray photodiodes in the third pixel are disposed in a third row and two other photodiodes are disposed in a fourth row, two visible ray photodiodes in the fourth pixel are disposed in the third row and two other photodiodes are disposed in the fourth row,
- wherein the pluralities of transistors are disposed between at least two of spaces between rows disposed over or under the first to fourth rows,
- wherein the visible ray photodiodes are spaced apart from the infrared-ray photodiode and the infrared-ray photodiode is disposed directly below each of the visible ray photodiodes, and
- wherein the infrared-ray photodiode receives infrared rays directly from each one of the visible ray photodiodes.

* * * * *